United States Patent
Ogawa

(10) Patent No.: US 10,052,699 B2
(45) Date of Patent: Aug. 21, 2018

(54) CUTTING TOOL, MANUFACTURING METHOD FOR CUTTING TOOL, AND METHOD FOR MANUFACTURING CUT PRODUCT USING CUTTING TOOL

(71) Applicant: KYOCERA Corporation, Kyoto-shi, Kyoto (JP)

(72) Inventor: Hiroshi Ogawa, Omihachiman (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/906,807

(22) PCT Filed: Jul. 16, 2014

(86) PCT No.: PCT/JP2014/068883
§ 371 (c)(1),
(2) Date: Jan. 21, 2016

(87) PCT Pub. No.: WO2015/012166
PCT Pub. Date: Jan. 29, 2015

(65) Prior Publication Data
US 2016/0167139 A1    Jun. 16, 2016

(30) Foreign Application Priority Data

Jul. 22, 2013  (JP) .................................. 2013-151342

(51) Int. Cl.
*B23B 51/02*    (2006.01)
*C23C 30/00*    (2006.01)
(Continued)

(52) U.S. Cl.
CPC ................ *B23B 51/02* (2013.01); *B23C 5/10* (2013.01); *C23C 14/024* (2013.01);
(Continued)

(58) Field of Classification Search
CPC .  Y10T 408/78; Y10T 408/81; B23B 2226/31; B23B 2226/315; B23B 51/02; B23B 2222/28; B23B 2224/12
(Continued)

(56) References Cited

U.S. PATENT DOCUMENTS 4,642,003 A  *  2/1987  Yoshimura .............. B23B 51/00
                                                                407/119
4,762,445 A  *  8/1988  Bunting .................. B23B 51/02
                                                                408/144

(Continued)

FOREIGN PATENT DOCUMENTS

CN          1859985 A       11/2006
CN          101831651 A      9/2010
(Continued)

OTHER PUBLICATIONS

International Search Report (Form PCT/ISA/210) dated Oct. 7, 2014 and issued for International Patent Application No. PCT/JP2014/068883.
(Continued)

*Primary Examiner* — Daniel Howell
*Assistant Examiner* — Yasir Diab
(74) *Attorney, Agent, or Firm* — Volpe and Koenig, P.C.

(57) ABSTRACT

A cutting tool based on an embodiment of the present invention is provided with a cylindrical main body section which is made of a cobalt-containing cemented carbide alloy and is rotatable about the central axis thereof, a cutting edge which is provided at at least one of the tip and the periphery of the main body section, a chip discharge groove which extends from the cutting edge toward the rear end of the main body section, and a coating layer which is made of diamond and covers the cutting edge, wherein the cobalt content of the surface of the main body section at the part (Continued)

coated with the coating layer is less than the cobalt content of the surface of the main body section at parts other than the part coated with the coating layer.

3 Claims, 18 Drawing Sheets

(51) Int. Cl.
| | |
|---|---|
| *C23C 14/02* | (2006.01) |
| *C23C 14/06* | (2006.01) |
| *B23C 5/10* | (2006.01) |
| *C23C 14/22* | (2006.01) |
| *C23C 16/44* | (2006.01) |
| *C23F 1/30* | (2006.01) |
| *C23F 1/00* | (2006.01) |
| *C23G 1/20* | (2006.01) |

(52) U.S. Cl.
CPC .......... *C23C 14/0641* (2013.01); *C23C 14/22* (2013.01); *C23C 16/44* (2013.01); *C23C 30/005* (2013.01); *C23F 1/00* (2013.01); *C23F 1/30* (2013.01); *C23G 1/20* (2013.01); *B23B 2222/28* (2013.01); *B23B 2226/31* (2013.01); *B23B 2226/315* (2013.01); *B23B 2228/105* (2013.01); *B23C 2222/28* (2013.01); *B23C 2226/31* (2013.01); *B23C 2226/315* (2013.01); *B23C 2228/10* (2013.01); *Y10T 408/78* (2015.01); *Y10T 408/81* (2015.01)

(58) Field of Classification Search
USPC ....................................................... 76/108.6
See application file for complete search history.

(56) References Cited

U.S. PATENT DOCUMENTS

| | | | | |
|---|---|---|---|---|
| 4,971,485 A | * | 11/1990 | Nomura | B23B 51/02 407/119 |
| 5,022,801 A | * | 6/1991 | Anthony | B23B 51/02 408/144 |
| 5,716,170 A | * | 2/1998 | Kammermeier | B23B 51/02 407/119 |
| 6,022,175 A | * | 2/2000 | Heinrich | C22C 29/005 407/118 |
| 2005/0069709 A1 | | 3/2005 | Lev et al. | |
| 2008/0019787 A1 | * | 1/2008 | Sampath | B23B 51/02 408/230 |
| 2008/0196318 A1 | * | 8/2008 | Bost | C23C 30/005 51/295 |
| 2010/0098505 A1 | * | 4/2010 | Garrick | B23B 51/02 407/113 |
| 2013/0209183 A1 | * | 8/2013 | Chuo | B23B 51/02 407/32 |

FOREIGN PATENT DOCUMENTS

| | | |
|---|---|---|
| JP | 04-275812 A | 10/1992 |
| JP | 07-88713 A | 4/1995 |
| JP | 2003-080413 A | 3/2003 |

OTHER PUBLICATIONS

Japanese Translation of Office Action issued by Taiwanese Paten Office and dated Dec. 3, 2015 for Taiwanese Patent Application No. 103124692.
Chinese Office Action with English concise explanation, Chinese Patent Application No. 201480039786.6, dated Dec. 5, 2016, 9 pgs.
Hiroyuki, Hanyu, "Cutting Edge Optimization of High-Performance Diamond-Coated Drill," Jewelry Science and Technology, Issue 3, pp. 34-38, 2003, Issue 3, with partial English translation.

* cited by examiner

CUTTING TOOL, MANUFACTURING METHOD FOR CUTTING TOOL, AND METHOD FOR MANUFACTURING CUT PRODUCT USING CUTTING TOOL

TECHNICAL FIELD

The present invention relates to a cutting tool used for drilling, a manufacturing method for a cutting tool, and a method for manufacturing a cut product using the cutting tool.

BACKGROUND ART

One example of a cutting tool which is rotatable about a central axis such as a drill or an end mill is the drill disclosed in Japanese Patent Laid-Open No. Hei 4-275812 (Patent Literature 1). As disclosed in Patent Literature 1, a cobalt-containing cemented carbide alloy is generally used as the base material of the drill. In addition, a diamond layer may be formed on the surface of the drill in order to improve the wear resistance of the cutting edge of the drill.

In a case where the cobalt content of the cemented carbide alloy is high, a layer made of graphite instead of diamond is easily formed at the formation of the diamond layer. This is because, when coating a member made of a cemented carbide alloy with diamond, graphite rather than diamond tends to be preferentially generated on the cobalt. Therefore, there is a demand for the cobalt content of the cemented carbide alloy used as the drill material to be low in order to satisfactorily carry out the diamond coating. However, when the cobalt content is excessively low throughout the cemented carbide alloy to be used, there is a problem in that the strength of the drill is reduced.

The present invention has been made in consideration of the problem described above, and an object of the present invention is to provide a cutting tool favorably coated with diamond while obtaining a favorable strength using a cemented carbide alloy.

SUMMARY OF INVENTION

A cutting tool based on one aspect of the present invention is provided with a cylindrical main body section which is made of a cobalt-containing cemented carbide alloy and is rotatable about a central axis thereof; a cutting edge which is provided at at least one of a tip and a periphery of the main body section; a chip discharge groove which extends from the cutting edge toward the rear end of the main body section; and a coating layer which is made of diamond and coats the cutting edge. In such a cutting tool, the cobalt content of the surface of the main body section at a part coated with the coating layer is less than the cobalt content of the surface of the main body section at parts other than the part coated with the coating layer.

DESCRIPTION OF EMBODIMENTS

Figure 1:
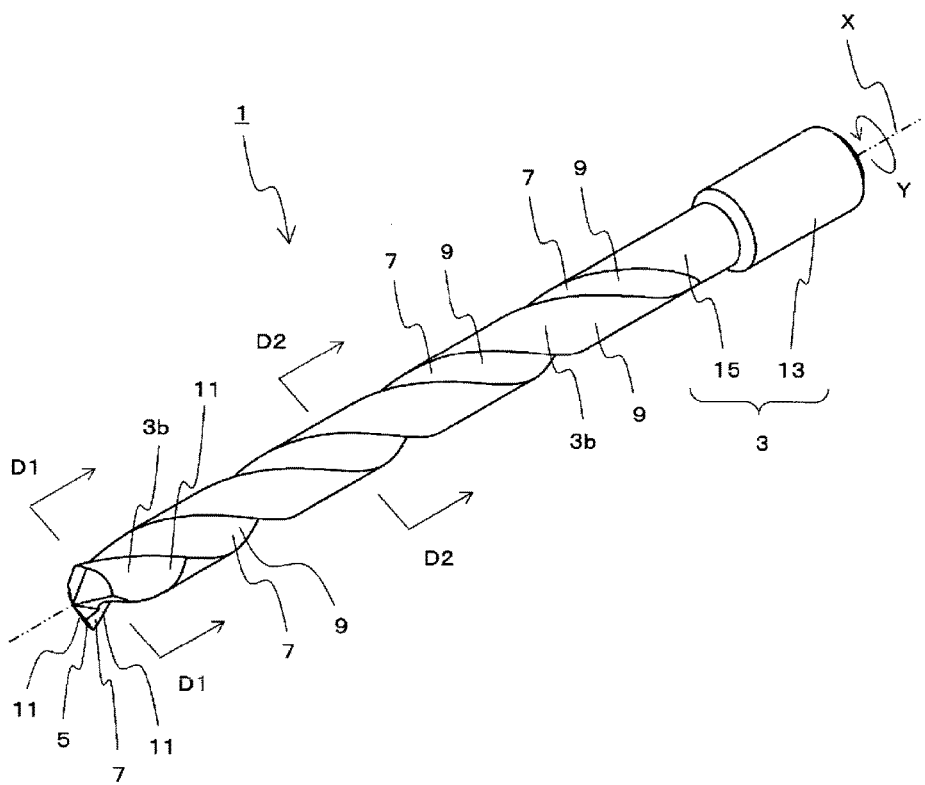
FIG. 1 is a perspective view of a cutting tool of a first embodiment of the present invention.

Detailed description will be given below of the cutting tool and the manufacturing method for a cutting tool of each embodiment of the present invention with reference to the diagrams. However, for convenience of explanation, each of the diagrams to which a reference is made below is simplified to illustrate only the main members necessary to illustrate the present invention out of the constituent members of the embodiments. Accordingly, the cutting tool of the present invention may be provided with any constituent member which is not illustrated in each of the diagrams to which a reference is made. In addition, the manufacturing method for a cutting tool of the present invention may be provided with any step which is not illustrated in each of the diagrams to which a reference is made. In addition, the dimensions of the members in each of the diagrams are not intended to faithfully represent the actual dimensions of the constituent members, the dimensional ratios of the members, or the like.

Examples of cutting tools which are rotatable about the central axis thereof include drills and end mills. In the first embodiment, description will be given of a drill as an example of a cutting tool. Needless to say, the cutting tool of the present invention is not limited to being a drill and may be used in a method for manufacturing an end mill. Therefore, in the second embodiment, description will be given of an end mill as an example of a cutting tool.

As illustrated in FIGS. 1 to 4, a cutting tool 1 of the first embodiment is provided with a cylindrical main body section 3 which is made of a cemented carbide alloy and is rotatable about a central axis X thereof, a cutting edge 5 provided on a tip 3*a* of the main body section 3, a chip discharge groove 7 (referred to below simply as "groove 7")

which extends from the cutting edge 5 toward the rear end of the main body section 3, and a first coating layer 11 which is made of diamond and coats the cutting edge 5, and a second coating layer 9 which is made of a chromium-containing non-oxide and coats the surface of the main body section 3 other than the part coated with the first coating layer 11.

In this manner, providing the cutting tool 1 of the present embodiment with the first coating layer 11 which coats the cutting edge 5 makes the wear resistance of the cutting edge 5 favorable. In addition, at the same time, the cutting tool 1 of the present embodiment is provided with the second coating layer 9 which coats the surface of the main body section 3 other than the part coated with the first coating layer 11. This suppresses an excessive decrease in the cobalt content of the whole main body section 3, which imparts favorable strength to the whole main body section 3.

As illustrated in FIG. 1, the main body section 3 has a central axis X and is formed in a cylindrical shape extending along the central axis X. The main body section 3 in the present embodiment is provided with a shank section 13 to be held by a rotatable spindle or the like of a machine tool (not illustrated), and a cutting section 15 located on the tip side of the shank section 13. The shank section 13 is designed according to the shape of the machine tool. The cutting section 15 comes into contact with the work material. Here, the arrow Y in FIG. 1 indicates the rotation direction of the main body section 3.

Figure 2:
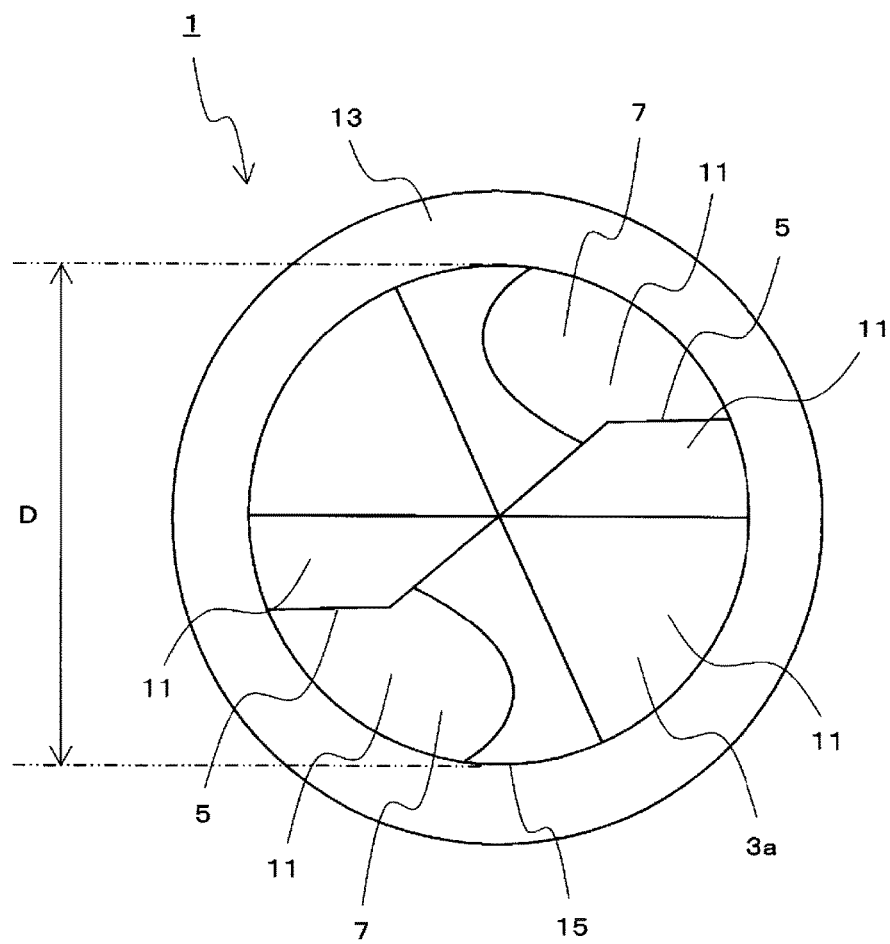
FIG. 2 is a front view of the tip side of the cutting tool illustrated in FIG. 1.
Figure 3:
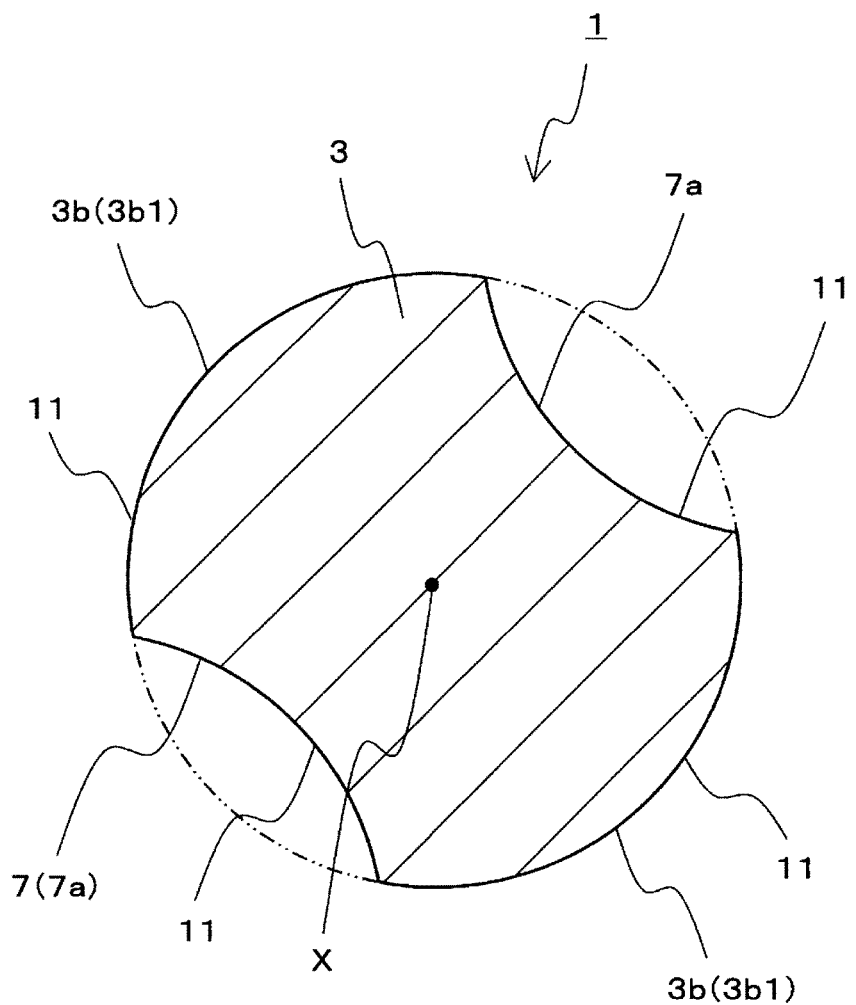
FIG. 3 is a cross-sectional view along a cross-section D1 of the cutting tool illustrated in FIG. 1.
Figure 4:
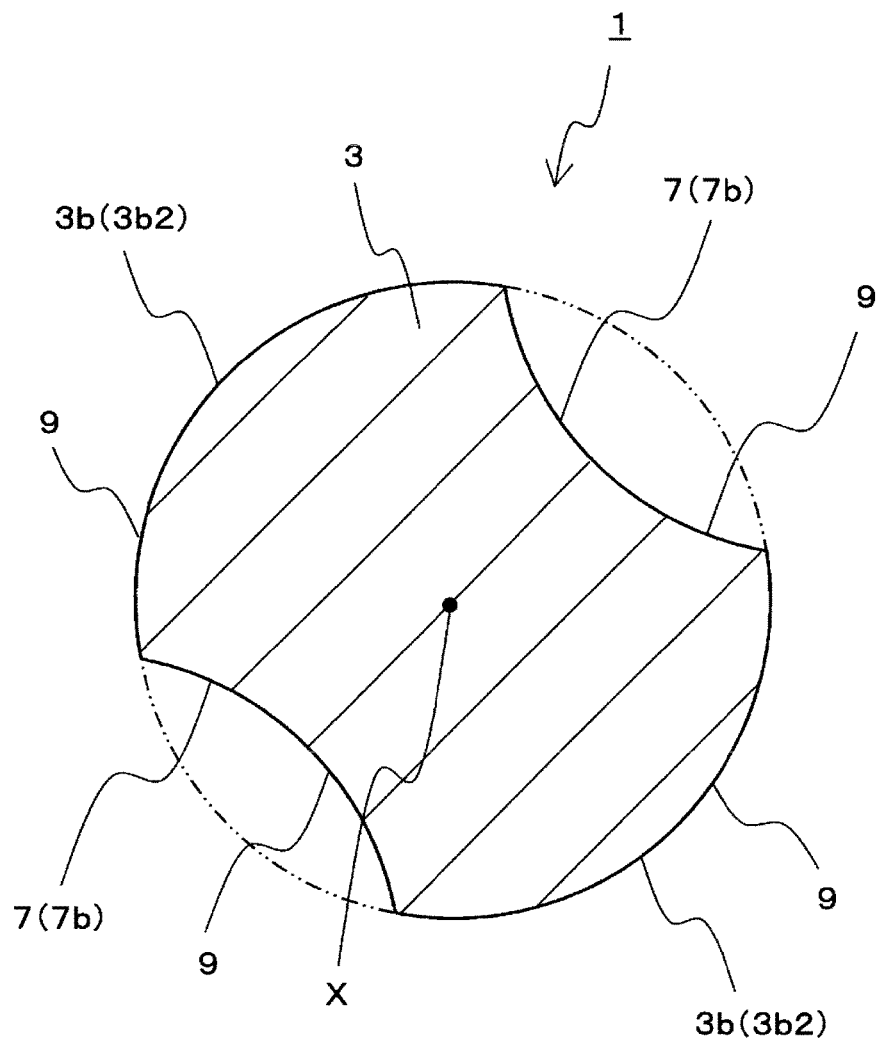
FIG. 4 is a cross-sectional view along a cross-section D2 of the cutting tool illustrated in FIG. 1.

As illustrated in FIG. 2, the outer diameter D of the cutting section 15 in the present embodiment can be set to 0.05 mm to 40 mm. In addition, the length in the direction along the central axis X of the main body section 3 can be set to approximately 3D to 25D.

Formed at at least one of the tip 3a and a periphery 3b of the main body section 3 is the cutting edge 5. In the present embodiment, the cutting tool 1 takes the form of the drill 1; thus, the cutting edge 5 is formed at the tip 3a of the main body section 3. In addition, formed at the periphery 3b of the main body section 3 is the groove 7. The groove 7 is provided to discharge chips cut by the cutting edge 5 from the rear end side of the main body section 3 and extends from the cutting edge 5 toward the rear end of the main body section 3.

In the present embodiment, two grooves 7 are formed spaced apart from one another. When the tip 3a of the main body section 3 is viewed in a direction along the central axis X or when viewed in the cross-section orthogonal to the central axis X in the main body section 3, these grooves 7 are provided so as to be located on opposite sides to each other centering on the central axis X, specifically, to be rotationally symmetric at 180 degrees centering on the central axis X.

The two grooves 7 are each formed in a spiral shape, extending from the cutting edge 5 toward the rear end of the main body section 3 centering on the central axis X. The grooves 7 may be formed in a straight line along the central axis X; however, forming the grooves 7 in a spiral shape as described above makes it possible to improve the chip dischargeability.

The grooves 7 are provided in order to discharge chips; thus, the grooves 7 are continuous from the cutting edge 5. The tip portions of the grooves 7 in the present embodiment are continuous from the cutting edge 5. Therefore, chips cut by the cutting edge 5 flow from the cutting edge 5 through the grooves 7 and are then discharged from the rear end side of the main body section 3. The grooves 7 in the present embodiment are formed in the cutting section 15 of the main body section 3. Therefore, the rear end portions of the grooves 7 are located at the rear end section of the cutting section 15. The grooves 7 may be formed in the shank section 13; however, not forming the grooves 7 in the shank section 13 allows the shank section 13 to be stably held in the machine tool.

The main body section 3 is made of a cemented carbide alloy which contains tungsten carbide (WC) as a hard metal carbide and contains cobalt (Co) as a binder. Specifically, the main body section 3 in the present embodiment contains WC fine particles as the main component and is formed with the Co which is the binder located between the WC fine particles. For example, a base material containing approximately 94 to 95 mass % of WC fine particles and approximately 5 to 6 mass % of Co can be used in the main body section 3. In terms of volume %, the content of Co in the base material in the present embodiment would be approximately 0.08 to 0.1 volume %. In the present embodiment, particles with a particle diameter of approximately 0.8 μm are used as the WC fine particles.

In addition, instead of being composed only of WC and Co, the cemented carbide alloy may include additives such as titanium carbide (TiC) or tantalum carbide (TaC).

The coating layer 11 (the first coating layer 11) made of a diamond crystal is formed at a tip region 3c including the cutting edge 5 at the tip 3a. This enables the wear resistance to be improved in the region including the cutting edge 5 where the first coating layer 11 is formed on the surface. The thickness of the first coating layer 11 is, for example, set to approximately 3 to 20 μm. Whether or not the first coating layer 11 is formed on the surface of the main body section 3 can be evaluated using Raman scattering spectroscopy or the X-ray diffraction method. Using the analysis methods described above, it can be determined whether the carbon layer formed on the surface of the main body section 3 is a layer made of a diamond crystal, or a layer made of diamond-like carbon or graphite.

Here, "a layer made of a diamond crystal" has the meaning of not being a layer made of graphite or a layer made of amorphous diamond (diamond-like carbon). Therefore, the first coating layer 11 is not limited to being made of one crystal and may be made of a cluster of a plurality of crystals.

As the second coating layer 9, there is a demand for a layer which can suppress the elution of the cobalt contained in the main body section 3 to the outside and, for example, a layer made of a non-oxide containing chromium or a non-oxide containing titanium such as TiN or TiC is used. In particular, examples of a chromium-containing non-oxide include chromium nitride (CrN), chromium carbide (CrC), and chromium boride (CrB).

It is sufficient if the second coating layer 9 has a thickness to the extent that the elution of the cobalt contained in the main body section 3 to the outside can be suppressed. Specifically, the thickness of the second coating layer 9 is set to approximately 0.1 to 10 μm.

The cutting tool 1 of the present embodiment is provided with the first coating layer 11 and the second coating layer 9 described above and the cobalt content of a part (referred to below as "first part" for the sake of convenience) coated with the first coating layer 11 is less than the cobalt content of parts other than the part (referred to below as "second part" for the sake of convenience) coated with the first coating layer 11 on the surface of the main body section 3.

That is, from a different point of view, the cutting tool 1 of the present embodiment is provided with the cylindrical main body section 3 which is made of a cemented carbide alloy and is rotatable about the central axis X, the cutting edge 5 which is provided at the tip 3a of the main body section 3, the groove 7 which extends from the cutting edge 5 toward the rear end of the main body section 3, and the first coating layer 11 which is made of diamond and coats the cutting edge 5. In the cutting tool 1, the cobalt content of the first part is less than the cobalt content of the second part.

In the cutting tool 1 of the present embodiment, the cobalt is substantially removed from the first part on the surface of the main body section 3 and the cobalt content of the first part is substantially 0. In addition, the cobalt content of the second part on the surface of the main body section 3 is approximately 5 to 6 mass %. Therefore, the wear resistance of the cutting edge 5 is favorable and the overall strength of the main body section 3 is favorable.

Here, the difference between the cobalt content of the first part on the surface of the main body section 3 and the cobalt content of the second part is not limited to the values described above, and it is sufficient if the cobalt content of the first part is, for example, within the range of from 0.01 mass % to 1 mass %, both inclusive. In addition, it is sufficient if the cobalt content of the second part is within the range of from 3 mass % to 10 mass %, both inclusive.

The method for manufacturing the cutting tool 1 of the first embodiment is provided with the following steps.

(1) Forming the cutting edge 5 at at least one of the tip 3a and the periphery 3b of the cylindrical main body section 3 which is made of a cemented carbide alloy and is rotatable about the central axis X and forming the groove 7 which extends from the cutting edge 5 toward the rear end of the main body section 3.

(2) Coating the surface of the main body section 3 with the second coating layer 9 which is made of a chromium-containing non-oxide.

(3) Partially removing the second coating layer 9 to expose the tip region 3c including the cutting edge 5.

(4) Eluting and removing cobalt from the tip region 3c exposed by carrying out chemical treatment on the main body section 3 to remove the second coating layer 9 in the main body section 3.

(5) Forming the first coating layer 11 made of diamond on the surface of the region from which the cobalt is removed in the main body section 3 by providing a carbon layer on the main body section 3 on which the chemical treatment has been carried out.

First, detailed description will be given of step (1).

Figure 5:
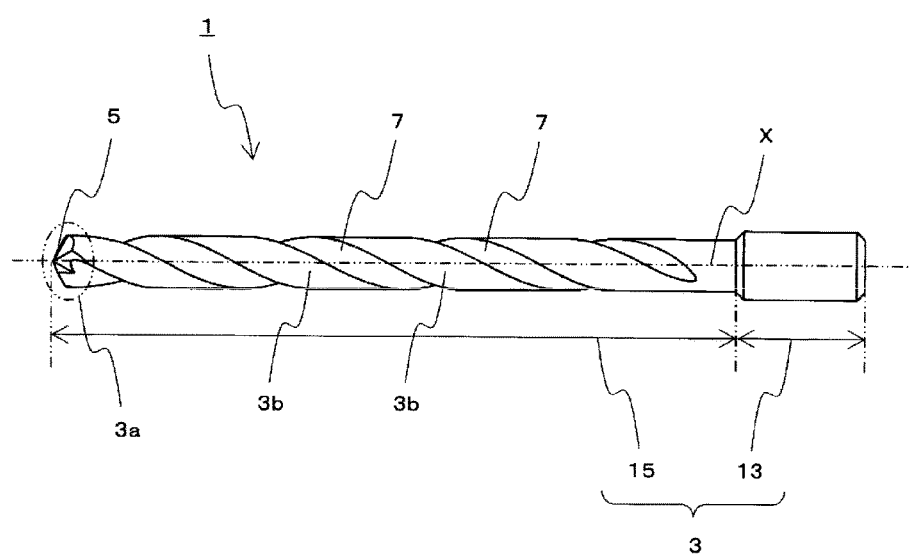
FIG. 5 is a side view of the cutting tool, illustrating a step of a manufacturing method for the cutting tool of the first embodiment of the present invention.

As illustrated in FIG. 5, in this step, a member is prepared as a base of the drill 1, the member being provided with the cylindrical main body section 3 which is made of a cemented carbide alloy and is rotatable about the central axis X, the cutting edge 5 which is provided at at least one of the tip 3a and the periphery 3b of the main body section 3, and the groove 7 which extends from the cutting edge 5 toward the rear end of the main body section 3.

Next, description will be given of step (2).

Figure 6:
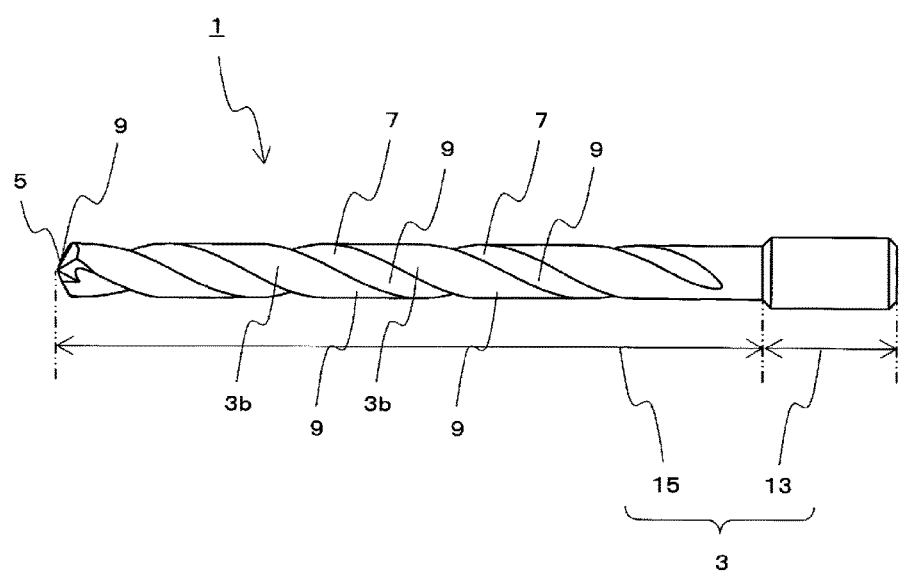
FIG. 6 is a side view of the cutting tool, illustrating a step of the manufacturing method for the cutting tool of the first embodiment of the present invention.

As illustrated in FIG. 6, in this step, the surface of the main body section 3 is coated with the second coating layer 9. Specifically, the surface of the member which is the base of the drill 1 prepared in step (1) is coated with the second coating layer 9. Therefore, the cutting edge 5 and the grooves 7 are also coated with the second coating layer 9.

The second coating layer 9 is intended for suppressing the elution of the cobalt contained in the main body section 3 in the step of eluting and removing the cobalt by a chemical treatment to be described below. Therefore, it is desirable that cobalt be hardly eluted from the region coated with the second coating layer 9 in the main body section 3; however, it is sufficient if the elution of the cobalt can be suppressed in comparison with the region which is not coated with the second coating layer 9.

The method for coating the surface of the main body section 3 with the second coating layer 9 is not limited to a specific method. Examples of coating methods include a physical vapor deposition (PVD) process, a chemical vapor deposition (CVD) process, and a sputtering process. In the manufacturing method of the present embodiment, a chromium nitride (CrN) layer is formed on the surface of the main body section 3 by the physical vapor deposition (PVD) process.

Next, description will be given of step (3).

Figure 7:
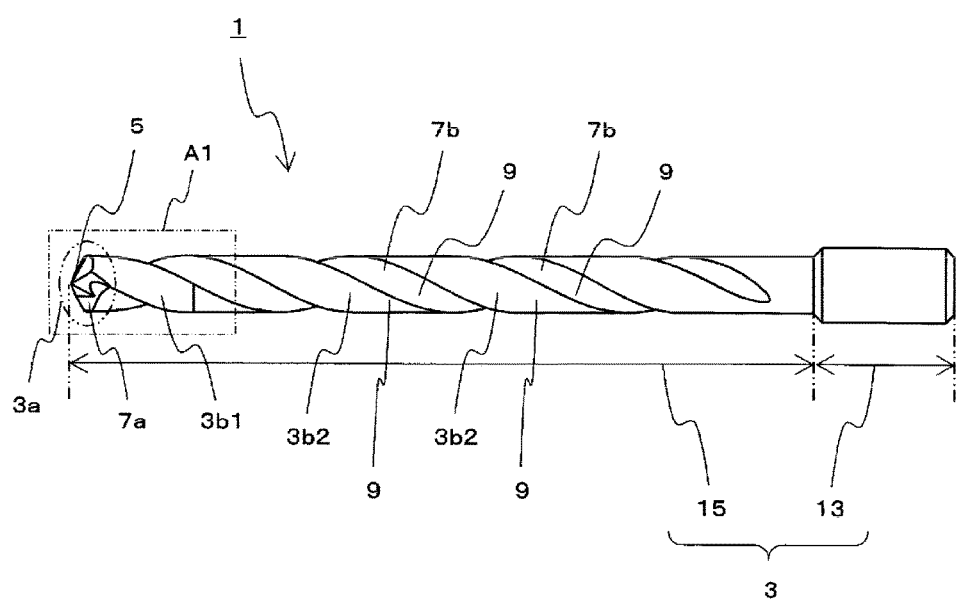
FIG. 7 is a side view of the cutting tool, illustrating a step of the manufacturing method for the cutting tool of the first embodiment of the present invention.
Figure 8:
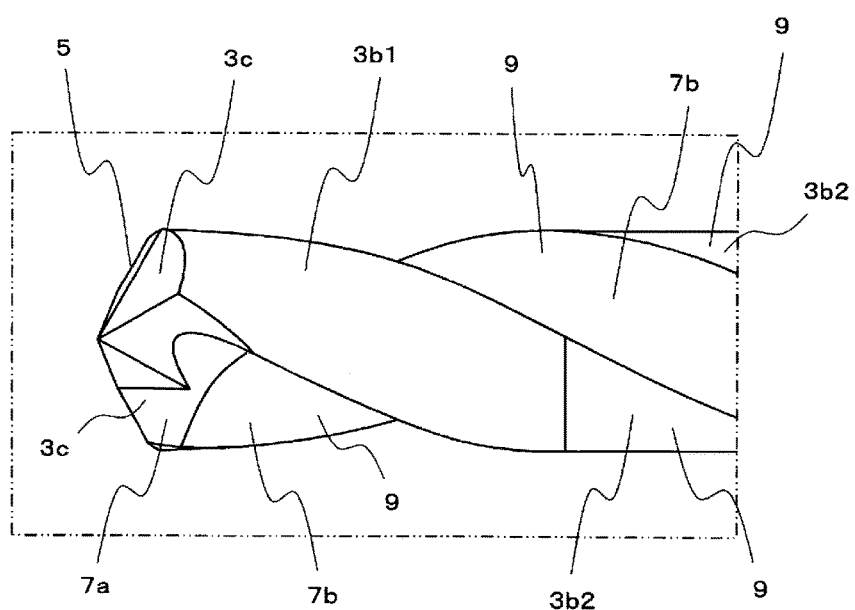
FIG. 8 is an enlarged view of a region A1 in FIG. 7.

As illustrated in FIGS. 7 and 8, in this step, the second coating layer 9 is partially removed such that the cutting edge 5 coated with the second coating layer 9 in step (2) is exposed. This step is intended for allowing the tip region 3c including the cutting edge 5 at the tip 3a to be coated with a coating layer (the first coating layer) made of a diamond crystal. Examples of methods for removing the second coating layer 9 include chemical etching and polishing processes. In the manufacturing method of the present embodiment, a part of the second coating layer 9 is removed by a polishing process.

In a case where the second coating layer 9 is partially removed by chemical etching, a film coating is necessary to prevent the etching of regions in which the second coating layer 9 is to be left. On the other hand, in a case where the second coating layer 9 is partially removed by a polishing process, there is no need for a film coating which prevents the etching described above.

In the present embodiment, the second coating layer 9 is removed so as to expose the tip 3a where the cutting edge 5 is formed and a part of the grooves 7 as well as a part of a region other than the grooves 7 at the periphery 3b of the main body section 3. In a case where the drill 1 manufactured by the manufacturing method of the present embodiment is used in cut processing, parts other than the cutting edge 5 at the tip 3a of the drill 1 also come into contact with the work material. Therefore, although a large load is applied to the cutting edge 5 carrying out the cut processing, a load is also applied to parts other than the cutting edge 5 at the tip 3a of the drill 1.

However, in a case where the second coating layer 9 is removed so as to expose the tip 3a where the cutting edge 5 is formed, the whole of the tip 3a, instead of only the cutting edge 5, of the drill 1 can be coated with the first coating layer made of a diamond crystal. Therefore, the wear resistance is improved throughout the tip 3a of the drill 1 which comes into contact with the work material.

The grooves 7 include a first region 7a located at the tip side and adjacent to the cutting edge 5 and a second region 7b located further toward the rear end than the first region 7a. The first region 7a can be set to a range of approximately 2 to 10% of the length of the whole of the grooves 7 in the direction along the central axis X. The second coating layer 9 coating the first region 7a is removed and the first region 7a is exposed. The second region 7b remains coated with the second coating layer 9.

A large load is applied to the first region 7a adjacent to the cutting edge 5 during the cut processing, which requires a high wear resistance in the first region 7a. Removing the second coating layer 9 coating the first region 7a makes it possible to coat the first region 7a with the first coating layer. On the other hand, in the second region 7b located further toward the rear end than the first region 7a, a high wear resistance is not required, but an increase in the strength of the main body section 3 by increasing the cobalt content is required. Therefore, in order to suppress a reduction in the cobalt content, the second region 7b remains coated with the second coating layer 9.

In addition, a region other than the grooves 7 at the periphery 3b of the main body section 3 includes a third region 3b1 located at the tip side and a fourth region 3b2 located further toward the rear end than the third region 3b1. The second coating layer 9 coating the third region 3b1 is removed and the third region 3b1 is exposed. The fourth region 3b2 remains coated with the second coating layer 9.

In a case where the drill 1 manufactured by the manufacturing method of the present embodiment is used in cut processing, there is a high possibility that a part located at the tip side of the periphery 3b of the drill 1 will come into contact with the work material. Therefore, a high wear resistance is required in this part. Removing the second coating layer 9 coating the third region 3b1 at the periphery 3b of the main body section 3 makes it possible to coat the third region 3b1 with the first coating layer.

On the other hand, in the fourth region 3b2 located further toward the rear end than the third region 3b1, the possibility of contact with the work material is low in comparison with the third region 3b1. Therefore, in comparison with the third region 3b1, a high wear resistance is not required in the fourth region 3b2, but an increase in the strength of the main body section 3 by increasing the cobalt content is required. Therefore, in order to suppress a reduction in the cobalt content, the fourth region 3b2 remains coated with the second coating layer 9.

Next, description will be given of step (4).

In a case where the cobalt content of the cemented carbide alloy is high, a layer made of graphite instead of diamond is easily formed at the formation of the diamond layer. Therefore, it is necessary to reduce the cobalt content of the cemented carbide alloy in order to form a coating layer made of a diamond crystal.

In the manufacturing method of the present embodiment, rather than reducing the cobalt content throughout the main body section 3, a chemical treatment is carried out on the main body section 3 to elute and remove the cobalt of a region in the main body section 3 exposed by removing the second coating layer 9. Specifically, the region exposed by removing the second coating layer 9 includes the tip region 3c including the cutting edge 5 at the tip 3a and the cobalt of the tip region 3c is eluted and removed. Therefore, it is possible to avoid unnecessarily reducing the cobalt content throughout the main body section 3.

In this step, by carrying out the chemical treatment on the main body section 3, the cobalt is eluted and removed from the region in the main body section 3 exposed by removing the second coating layer 9. As the chemical treatment in this step, an alkali etching process is carried out and then an acid etching process is carried out in the manufacturing method of the present embodiment.

As the alkali etching process, an etching process is carried out using a solution (Murakami's reagent) in which 10 mass % of potassium hydroxide (KOH) and 10 mass % of potassium ferricyanide ($K_3Fe(CN)_6$) are dissolved in distilled water. In addition, as the acid etching process, an etching process is carried out using persulfuric acid ($H_2SO_5$). Although the optimal conditions are different depending on the composition and thickness of the second coating layer 9, the alkali etching process may be carried out for approximately 30 seconds to 10 minutes and the acid etching process may be carried out for approximately 10 to 60 seconds.

As a result of these etching processes, the cobalt is eluted and removed from the exposed region in the main body section 3. In addition, in the region coated with the second coating layer 9 in the main body section 3, the elution of the cobalt is suppressed by the second coating layer 9. In the present embodiment, the cobalt is hardly eluted from the region coated with the second coating layer 9 in the main body section 3 while the cobalt is substantially removed from a part with at least a thickness of 0.1 to 0.3 μm from the surface in the region which is not coated with the second coating layer 9. In addition, the cobalt content is decreased in a part with a thickness of 0.3 to 10 μm from the surface.

As a result, the cobalt content of the part coated with the second coating layer 9 on the surface of the main body section 3 is greater than the cobalt content of the part on the surface of the main body section 3 which is exposed by removing the second coating layer 9. That is, instead of decreasing the cobalt content throughout the main body section 3, the cobalt content can be decreased in only the necessary minimum surface area including the cutting edge 5.

Next, description will be given of step (5).

Figure 9:
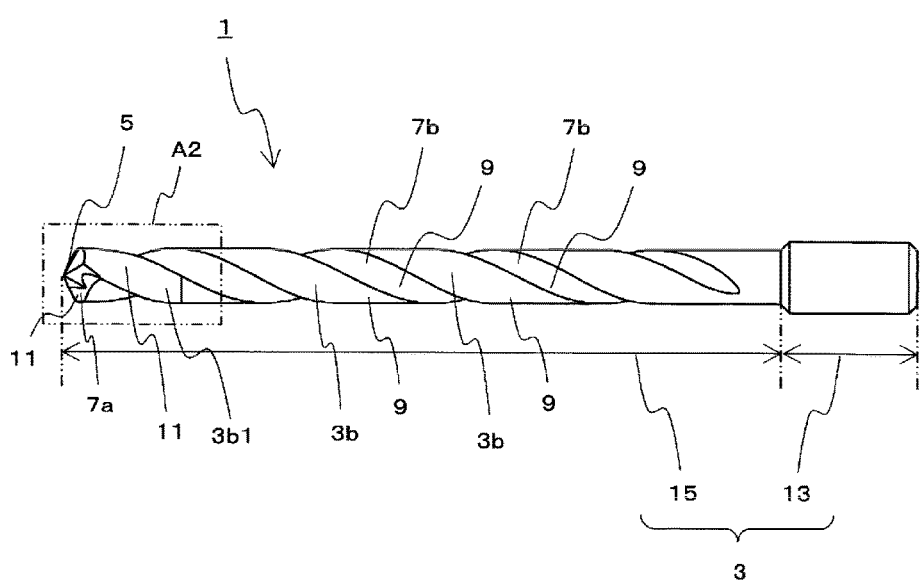
FIG. 9 is a side view of the cutting tool, illustrating a step of the manufacturing method for the cutting tool of the first embodiment of the present invention.
Figure 10:
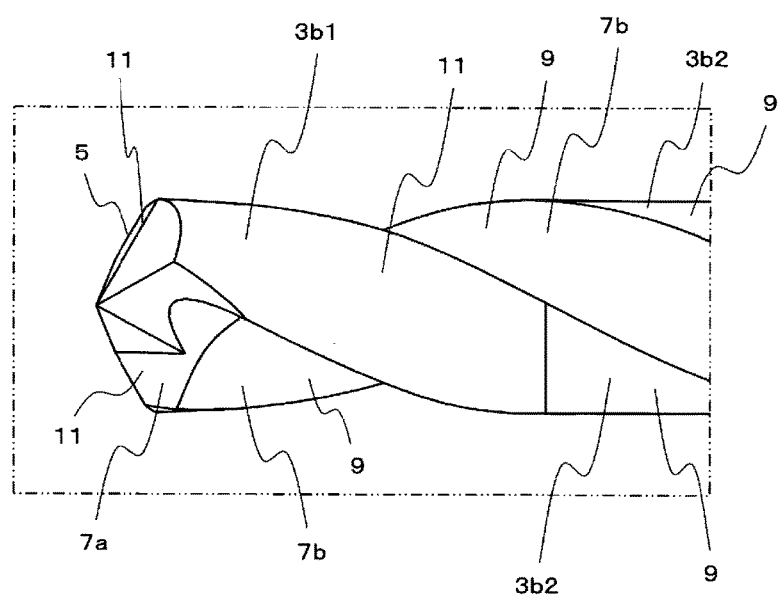
FIG. 10 is an enlarged view of a region A2 in FIG. 9.

In this step, as illustrated in FIGS. 9 and 10, a carbon layer is provided on the surface of the main body section 3 on which the chemical treatment has been carried out. As the method of providing the carbon layer, for example, a hot filament CVD method or the like may be used. In the present embodiment, the carbon layer is provided on the surface of the main body section 3 over approximately 12 hours using the hot filament CVD method.

As illustrated above, in a case where the cobalt content of the cemented carbide alloy is high, a layer made of graphite instead of diamond is easily formed at the formation of the diamond layer. However, in the manufacturing method of the present embodiment, the second coating layer 9 is partially removed in the main body section 3. Therefore, the cobalt included in the region not coated with the second coating layer 9 in the main body section 3 is removed by the chemical treatment.

In the main body section 3, it is desirable that the cobalt content be hardly decreased in the part coated with the second coating layer 9 which remains without being removed in step (3); however, it is sufficient if a decrease in the cobalt content is suppressed at least in the part which is coated with the second coating layer 9. This is to suppress a reduction in the overall strength of the main body section 3.

Here, the present embodiment may be further provided with the following steps before step (5). First, a suspension in which diamond particles with a particle diameter of approximately 1 to 3 μm are mixed in ethyl alcohol is prepared. The main body section 3 of which the second coating layer 9 is partially removed in step (4) is immersed in this suspension and ultrasonic waves are applied thereto for approximately 20 minutes. Providing such a step can facilitate the formation of the first coating layer 11 with a thickness of approximately several tens of μm in step (5).

As described above, the manufacturing method of the present embodiment includes steps (1) to (5) described above and, instead of reducing the cobalt content throughout the main body section 3, decreases the cobalt content in only the necessary minimum surface area including the cutting edge 5. Therefore, the first coating layer 11 can be favorably formed on the cutting edge 5 which is required to have the first coating layer 11 formed on the surface thereof while suppressing a reduction in the overall strength of the main body section 3.

Figure 11:
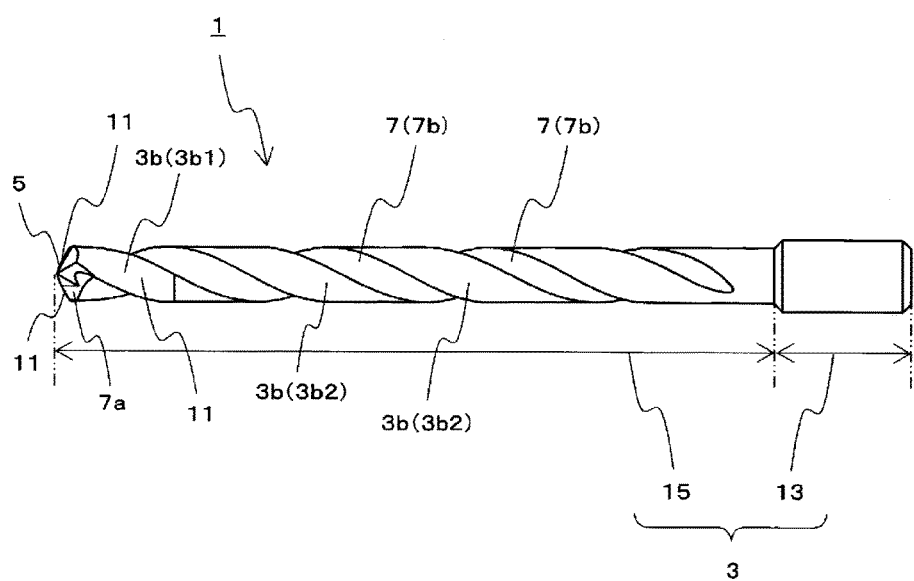
FIG. 11 is a side view of a cutting tool, illustrating a step of a modified example of the manufacturing method for the cutting tool of the first embodiment of the present invention.
Figure 12:
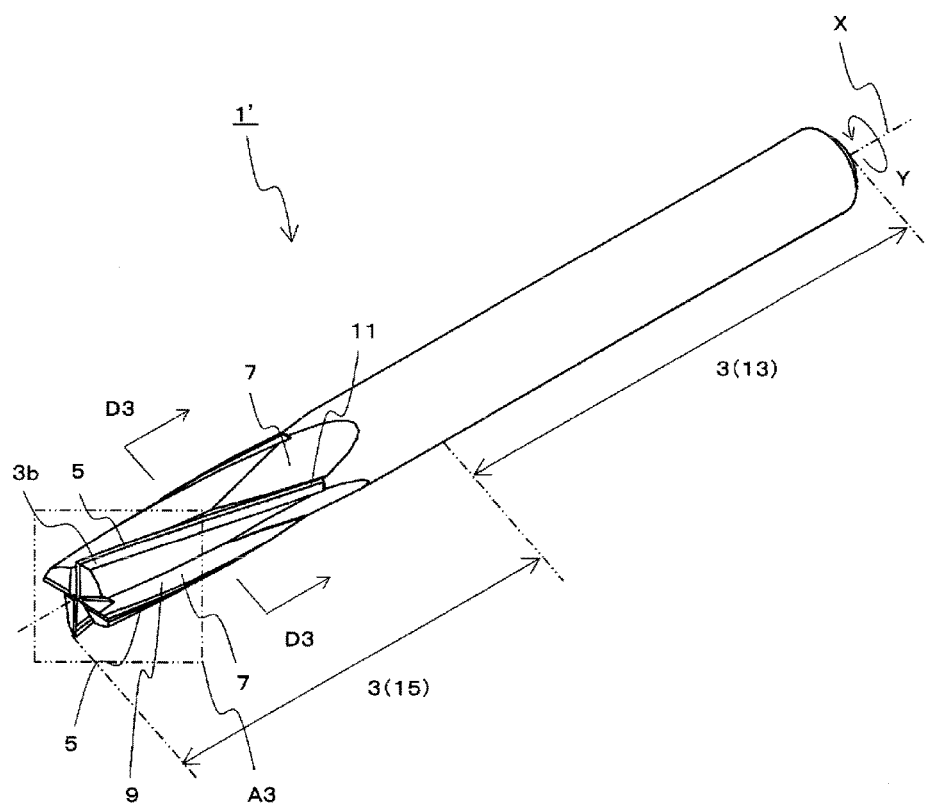
FIG. 12 is a perspective view of a cutting tool of a second embodiment of the present invention.
Figure 13:
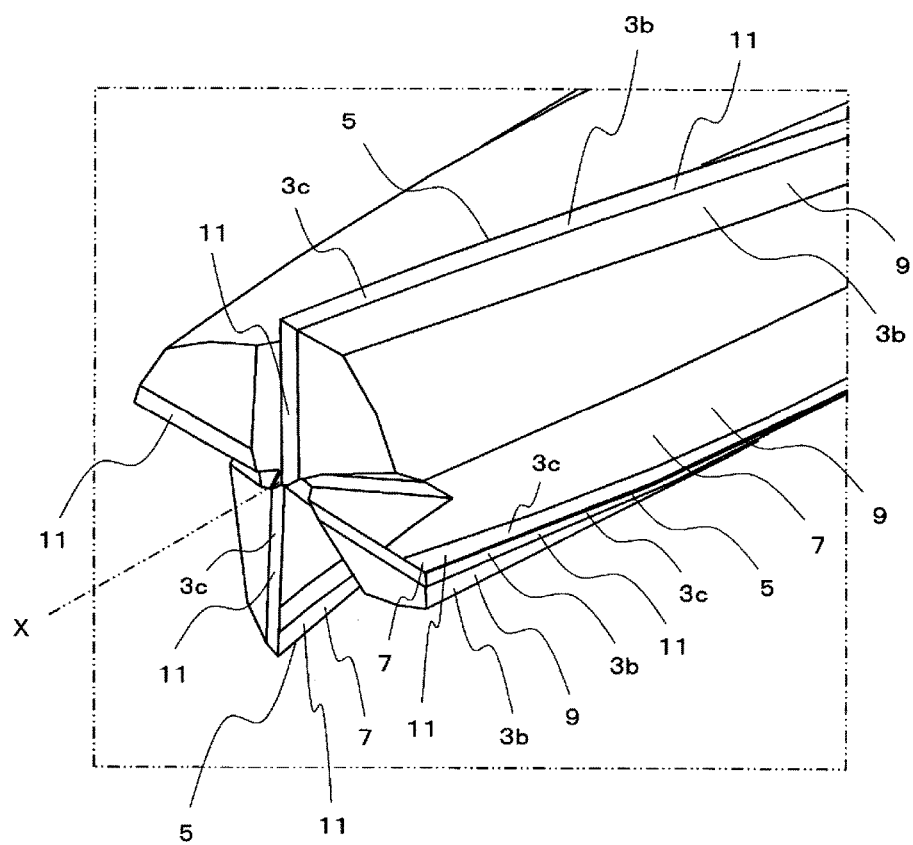
FIG. 13 is an enlarged view of a region A3 in FIG. 12.
Figure 14:
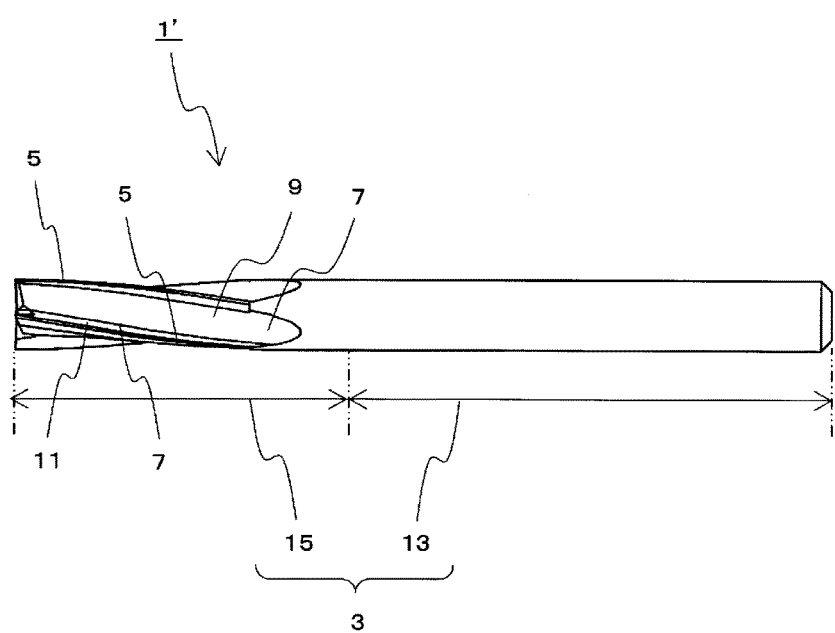
FIG. 14 is a side view of the cutting tool illustrated in FIG. 12.
Figure 15:
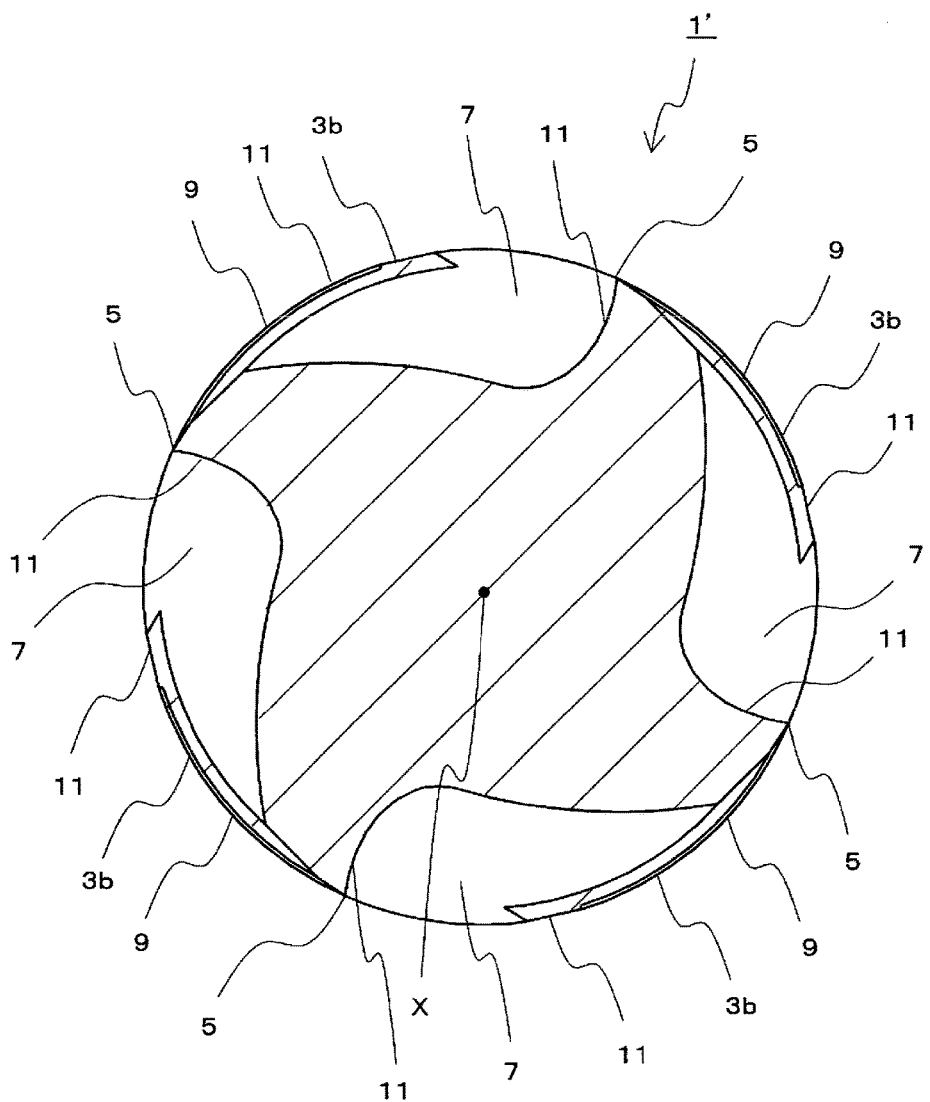
FIG. 15 is a cross-sectional view in a cross-section D3 of the cutting tool illustrated in FIG. 12.

Here, in the manufacturing method of the present embodiment, a layer made of amorphous diamond may be formed on the surface of a part coating the grooves 7 in the second coating layer 9. In such a case, after step (5), if the possibility of the reduction in the cobalt content in the main body section is small, as illustrated in FIG. 11, there is no problem even if all of the second coating layer 9 is removed.

In addition, the grooves 7 in the present embodiment include the first region 7a and the second region 7b. Then, as the first region 7a is exposed as illustrated in step (3) described above, in step (5) described above, the first region 7a is coated with the first coating layer 11 and the second region 7b is coated with the second coating layer 9 without being coated with the first coating layer 11. Therefore, as described above, the wear resistance can be increased in the first region 7a adjacent to the cutting edge 5 and the strength can be increased in the second region 7b.

In addition, the region other than the grooves 7 at the periphery 3b of the main body section 3 in the present embodiment includes the third region 3b1 and the fourth region 3b2. Then, as the third region 3b1 is exposed as illustrated in step (3) described above, in step (5) described above, the third region 3b1 is coated with the first coating layer 11 and the fourth region 3b2 is coated with the second coating layer 9 without being coated with the first coating layer 11. Therefore, as described above, the wear resistance can be increased in the third region 3b1 which frequently comes into contact with the work material, and the strength can be increased in the fourth region 3b2.

Next, detailed description will be given of a cutting tool 1' of the second embodiment of the present invention and a method for manufacturing the cutting tool 1' with reference to the diagrams. Here, description will be given of points of difference between the present embodiment and the first embodiment. Therefore, for the points which are the same as the first embodiment, the same reference numerals will be used and description thereof will be omitted.

In the cutting tool of the first embodiment, description has been given with a drill as an example of the cutting tool; however, for the cutting tool of the present embodiment, description will be given with an end mill as the cutting tool.

As illustrated in FIGS. 12 to 15, the cutting tool 1' of the present embodiment is provided with a cylindrical main body section 3 which is made of a cemented carbide alloy and is rotatable about a central axis X, a cutting edge 5 which is provided at a periphery 3b of the main body section 3, and a groove 7 which extends from the cutting edge 5 toward the rear end of the main body section 3, a first coating layer 11 which is made of diamond and coats the cutting edge 5, and a second coating layer 9 which is made of a chromium-containing non-oxide and coats the surface of the main body section 3 other than the part coated with the first coating layer 11.

In this manner, the cutting tool 1' of the present embodiment is provided with the first coating layer 11 which coats the cutting edge 5, which imparts favorable wear resistance to the cutting edge 5. In addition, the cutting tool 1' of the present embodiment is provided with the second coating layer 9 which coats the surface of the main body section 3 other than the part coated with the first coating layer 11. This suppresses an excessive decrease in the cobalt content of the whole main body section 3, which imparts favorable strength to the whole main body section 3.

The main body section 3 in the present embodiment is provided with a shank section 13 and a cutting section 15 in the same manner as the main body section 3 in the first embodiment. In the case of the end mill 1', the cutting edge 5 is formed at the periphery 3b of the main body section 3. Specifically, in the present embodiment, the plurality of grooves 7 are formed in a spiral shape, extending from the tip of the main body section 3 toward the rear end, and the cutting edges 5 are respectively formed at intersection points between the part other than the plurality of grooves 7 and the plurality of grooves 7 at the periphery 3b of the main body section 3. That is, each of these cutting edges 5 is formed in a spiral shape, extending from the tip of the main body section 3 toward the rear end centering on the central axis X.

Therefore, in the cutting tool 1' of the present embodiment, the cutting edges 5 are formed in a spiral shape, extending from the tip of the main body section 3 toward the rear end, and the grooves 7 are formed in a spiral shape, extending from the tip of the main body section 3 toward the rear end along the cutting edges 5.

The cutting tool 1' of the present embodiment is provided with the first coating layer 11 and the second coating layer 9 in the same manner as the cutting tool of the first embodiment, and the cobalt content of a part (referred to below as "third part" for the sake of convenience) coated with the first coating layer 11 is less than the cobalt content of parts other than the part (referred to below as "fourth part" for the sake of convenience) coated with the first coating layer 11 on the surface of the main body section 3.

That is, from a different point of view, the cutting tool 1' of the present embodiment, as illustrated in FIGS. 12 to 15, is provided with the cylindrical main body section 3 which is made of a cemented carbide alloy and is rotatable about the central axis X, the cutting edge 5 which is provided at the periphery 3b of the main body section 3, the groove 7 which extends from the cutting edge 5 toward the rear end of the main body section 3, and the first coating layer 11 which is made of diamond and coats the cutting edge 5. In the cutting tool 1, the cobalt content of the third part is less than the cobalt content of the fourth part.

In the present embodiment, as described above, the cobalt is eluted and substantially removed from the third part on the surface of the main body section 3, and the cobalt content of the third part is substantially 0. In addition, the cobalt is hardly eluted from the fourth part on the surface of the main body section 3, and the cobalt content of the fourth part is approximately 5 to 6 mass %. This imparts favorable wear resistance to the cutting edge 5 and favorable strength to the whole main body section 3.

Here, the difference between the cobalt content of the third part on the surface of the main body section 3 and the cobalt content of the fourth part is not limited to the values described above, and it is sufficient if the cobalt content of the third part is, for example, within the range of from 0.01 mass % to 1 mass %, both inclusive. In addition, the cobalt content of the fourth part may be within the range of from 3 mass % to 10 mass %, both inclusive.

The manufacturing method of the present embodiment is also provided with the following steps in the same manner as the manufacturing method of the first embodiment.

(1) Forming the cutting edge 5 at at least one of the tip and the periphery 3b of the cylindrical main body section 3 which is made of a cemented carbide alloy and is rotatable about the central axis X and forming the groove 7 which extends from the cutting edge 5 toward the rear end of the main body section 3.

(2) Coating the surface of the main body section 3 with the second coating layer 9 which is made of a chromium-containing non-oxide.

(3) Partially removing the second coating layer 9 to expose the tip region 3c including the cutting edge 5.

(4) Eluting and removing cobalt from the tip region 3c exposed by carrying out chemical treatment on the main body section 3 to remove the second coating layer 9 in the main body section 3.

(5) Forming the first coating layer 11 made of diamond on the surface of the region from which the cobalt is removed in the main body section 3 by providing a carbon layer on the main body section 3 on which the chemical treatment has been carried out.

In step (1) in the manufacturing method of the present embodiment, as described above, the location at which the cutting edge 5 is formed, and the like are different from the first embodiment.

Step (2) in the manufacturing method of the present embodiment is the same process as step (2) in the manufacturing method of the first embodiment.

In the manufacturing method of the present embodiment, the location at which the cutting edge 5 is formed is different from the manufacturing method of the first embodiment. Therefore, in step (3) in the manufacturing method of the present embodiment, specifically, the part where the second coating layer 9 is removed is different from step (3) in the manufacturing method of the first embodiment. In the first embodiment, the second coating layer 9 is removed so as to expose the tip 3a where the cutting edge 5 is formed, a part of the grooves 7, and a part of a region other than the grooves 7 at the periphery 3b of the main body section 3; however, in the present embodiment, the second coating layer 9 is partially removed to expose the region along the cutting edge 5 in each of the grooves 7 and a region other than the grooves 7 at the periphery 3b of the main body section 3.

At this time, instead of exposing the whole of the periphery 3b of the main body section 3, the second coating layer 9 is partially removed such that only the region along the cutting edge 5 is exposed. Therefore, an excessive decrease in the cobalt content of the main body section 3 is suppressed in step (4) of the present embodiment.

Steps (4) and (5) in the manufacturing method of the present embodiment are the same processes as steps (4) and (5) in the manufacturing method of the first embodiment. However, in the manufacturing method of the present embodiment, the location at which the cutting edge 5 is formed is different from the first embodiment. Therefore, the exact locations of the region from which the cobalt is eluted and the region on which the first coating layer 11 is formed are different according to the difference in the locations of the respective cutting edges 5 in the two embodiments.

<Method For Manufacturing A Cut Product>

Next, detailed description will be given of the method for manufacturing a cut product of an embodiment of the present invention using a case where the drill 1 of the first embodiment described above is used as the cutting tool 1 as an example. Below, description will be given with reference to FIGS. 16 to 18.

The cut product is manufactured by carrying out cut processing on a work material 101. The method for manufacturing a cut product in the present embodiment is provided with the following steps. That is, (1) rotating the drill 1 represented in the embodiment described above about the central axis X, (2) bringing the cutting edge 5 of the rotating cutting tool 1 into contact with the work material 101, and (3) separating the cutting tool 1 from the work material 101 are provided.

Figure 16:
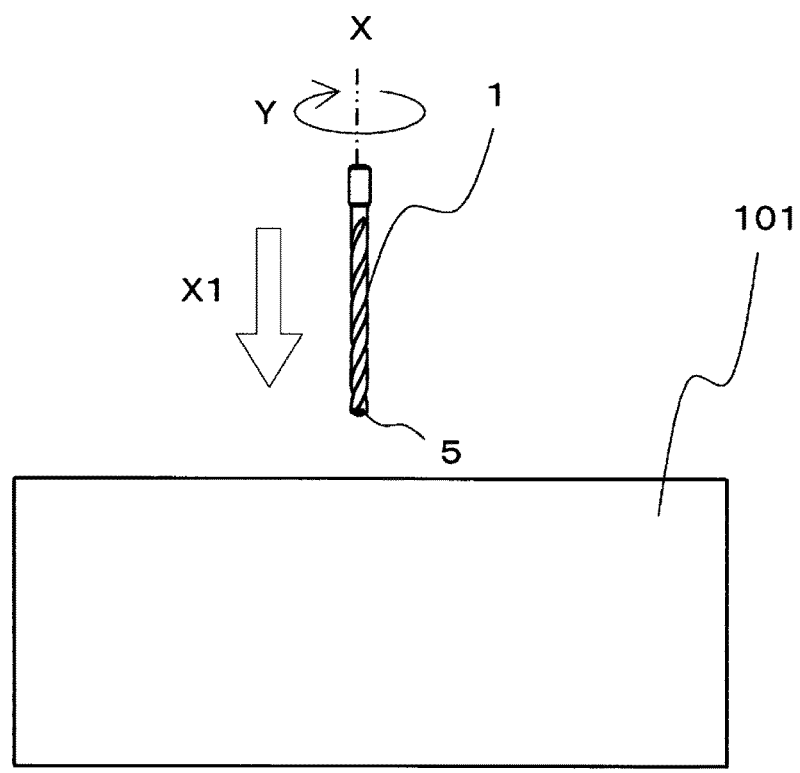
FIG. 16 is a perspective view illustrating a step of a method for manufacturing a cut product of one embodiment of the present invention.
Figure 17:
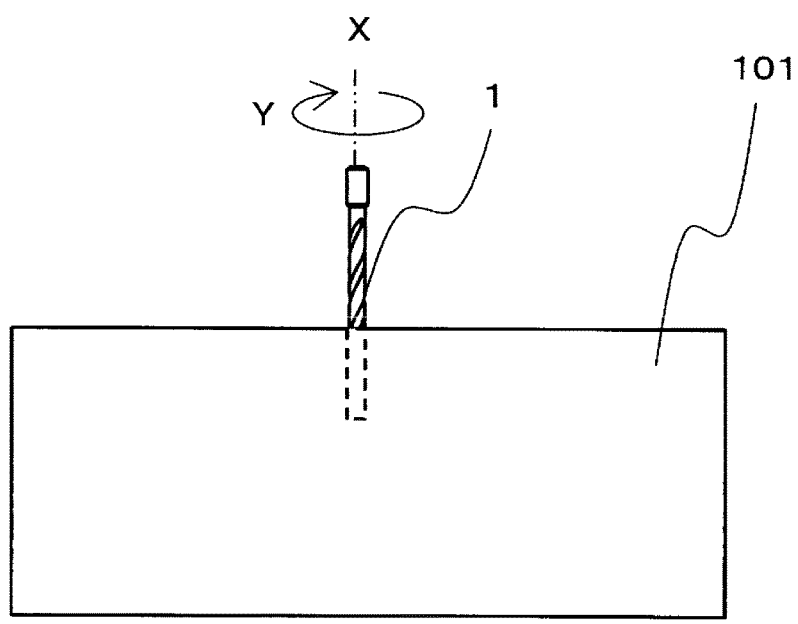
FIG. 17 is a perspective view illustrating a step of the method for manufacturing the cut product of one embodiment of the present invention.

More specifically, first, as illustrated in FIG. 16, the drill 1 is located above the prepared work material 101, and the drill 1 is rotated in the direction of the arrow Y centering on the central axis X. Then, as illustrated in FIG. 17, the rotating drill 1 is brought toward the work material 101 in the X1 direction in order to bring the cutting edge 5 into contact with the work material 101.

For example, this step can be carried out by fixing the work material 101 on a table of a machine tool to which the drill 1 is attached and bringing the rotating drill 1 toward the work material 101. Here, in this step, it is sufficient to bring the work material 101 and the drill 1 relatively toward each other and, for example, the work material 101 may be brought toward the drill 1.

Then, by bringing the cutting edge 5 of the rotating drill 1 into contact with the desired location on the surface of the work material 101, a machined hole (a through hole) is formed in the work material 101. In a case where the drill 1 is used as the cutting tool 1, the cutting tool 1 is brought into contact with the work material 101 from above. In a case where the end mill 1 is used as the cutting tool 1, the cutting tool 1 is brought into contact with the work material 101 from the side.

In this step, from the viewpoint of obtaining an excellent finished surface, the rear end section in the cutting section of the drill 1 is preferably set so as to not pass through the work material 101. That is, the rear end section functions as a margin region for discharging chips and makes it possible to exhibit excellent chip dischargeability via this region.

Here, in a case where the drill 1 is used as the cutting tool 1, a machined hole (a through hole) can be formed in the work material 101; however, in a case where the end mill 1 is used as the cutting tool 1, various milling processes such as periphery cutting and groove cutting can be carried out on the work material 101.

Figure 18:
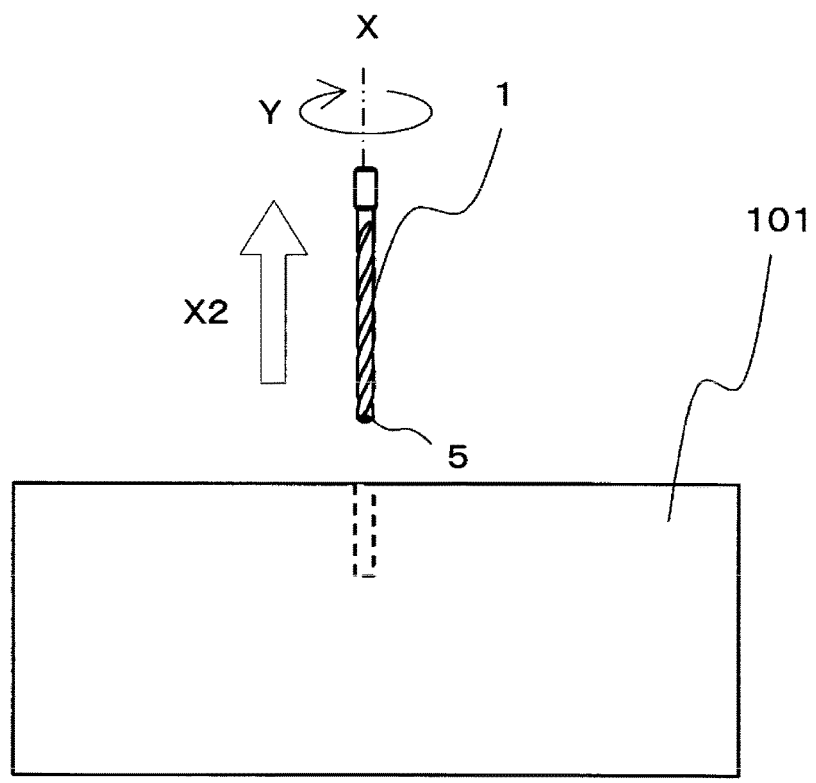
FIG. 18 is a perspective view illustrating a step of the method for manufacturing the cut product of one embodiment of the present invention.

As illustrated in FIG. 18, at the stage when the cut processing on the work material 101 is complete, the drill 1 is separated from the work material 101 in the X2 direction. Also in this step, in the same manner as step (2) described above, it is sufficient to relatively separate the work material 101 and the drill 1 and, for example, the work material 101 may be separated from the drill 1.

Through the steps described above, it is possible to achieve excellent hole workability.

Here, in a case where the cut processing on the work material as described above is carried out a plurality of times, and, for example, a plurality of machined holes (through holes) are formed in one work material 101, the step of bringing the cutting edge 5 of the drill 1 into contact with a different location of the work material 101 may be repeated with the drill 1 being rotated.

Several embodiments of the present invention have been illustrated above; however, needless to say, the present invention is not limited thereto and can take any form which does not depart from the spirit of the present invention.

REFERENCE SIGNS LIST

1 Cutting Tool (drill)
1' Cutting Tool (end mill)
3 Main Body Section
3a Tip
3b Periphery
3b1 Third Region
3b2 Fourth Region
3c Tip Region
5 Cutting Edge
7 Chip Discharge Groove (groove)
7a First Region 7b Second Region
9 Second Coating Layer
11 First Coating Layer (coating layer)
13 Shank Section
15 Cutting Section
101 Work Material

The invention claimed is:

1. A cutting tool comprising:
   a cylindrical main body section which is made of a cobalt-containing cemented carbide alloy and is rotatable about a central axis thereof, the main body section comprising a cutting section and a shank section;
   a cutting edge which is provided at least one of a tip and a periphery of the cutting section of the main body section;
   a chip discharge groove which extends from the cutting edge toward a rear end of the cutting section of the main body section; and
   a coating layer which is made of diamond and coats the cutting edge,
   wherein a cobalt content of a surface of the main body section at a part of the cutting section coated with the coating layer is less than a cobalt content of the surface of the main body section at parts of the cutting section other than the part coated with the coating layer.

2. The cutting tool according to claim 1,
   wherein the chip discharge groove includes:
      a first region which is located adjacent to the cutting edge and is coated with the coating layer, and
      a second region which extends from the first region toward the rear end of the main body section and is not coated with the coating layer.

3. The cutting tool according to claim 2,
   wherein a region other than the chip discharge groove at the periphery of the main body section includes:
      a third region which is located on the tip side and is coated with the coating layer, and
      a fourth region which extends from the third region toward the rear end of the main body section and is not coated with the coating layer.

* * * * *